United States Patent
Dasgupta et al.

(10) Patent No.: US 6,437,612 B1
(45) Date of Patent: Aug. 20, 2002

(54) INDUCTOR-LESS RF/IF CMOS BUFFER FOR 50Ω OFF-CHIP LOAD DRIVING

(75) Inventors: Uday Dasgupta; Wooi Gan Teoh, both of Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 09/996,287

(22) Filed: Nov. 28, 2001

(51) Int. Cl.[7] .............................. H03B 1/00; H03K 3/00
(52) U.S. Cl. ...................... 327/108; 327/54; 330/260
(58) Field of Search ........................... 330/252–254, 330/259, 260, 269–271, 277, 282, 290, 291; 327/52–54, 56, 72, 73, 87, 89, 108, 437, 560–563

(56) References Cited

U.S. PATENT DOCUMENTS

| | | | |
|---|---|---|---|
| 4,390,852 A | | 6/1983 | Addis .......................... 330/300 |
| 4,471,319 A | | 9/1984 | Metz .......................... 330/149 |
| 4,495,471 A | | 1/1985 | Barrett ........................ 330/151 |
| 5,047,657 A | * | 9/1991 | Seevinck et al. ............ 327/306 |
| 5,111,157 A | | 5/1992 | Komiak ....................... 330/286 |
| 5,122,915 A | * | 6/1992 | Klein et al. .................... 360/67 |
| 5,668,500 A | | 9/1997 | LeFevre ...................... 330/253 |
| 5,675,294 A | * | 10/1997 | Shyu et al. .............. 331/108 D |
| 5,877,634 A | | 3/1999 | Hunley .......................... 326/83 |
| 5,959,475 A | | 9/1999 | Zomorrodi ................... 327/112 |
| 6,049,246 A | * | 4/2000 | Kozisek et al. ............. 330/253 |
| 6,052,028 A | | 4/2000 | Heaton ........................ 330/263 |

* cited by examiner

*Primary Examiner*—My-Trang Nu Ton
(74) *Attorney, Agent, or Firm*—George O. Saile; Stephen B. Ackerman

(57) ABSTRACT

A buffer amplifier comprising a source follower-common drain circuit with a feedback path from the output of the drain follower to the input gate of the source follower. The feedback circuit is designed such that the output of the drain follower can be guaranteed to be at a voltage midway between the positive and the negative voltage supply of the circuit. This is the optimum operating point since it allows the largest signal swing. A small transconductance is realized by biasing the transistors of the feedback amplifier with very low currents; preferably by operating them in their weak inversion region. Feedback through the feedback amplifier is only present at DC (direct current) and at very low frequencies. This stabilizes the DC voltage at the drain of the common drain transistor, which, via an output capacitor, is also the output of the buffer amplifier.

38 Claims, 6 Drawing Sheets

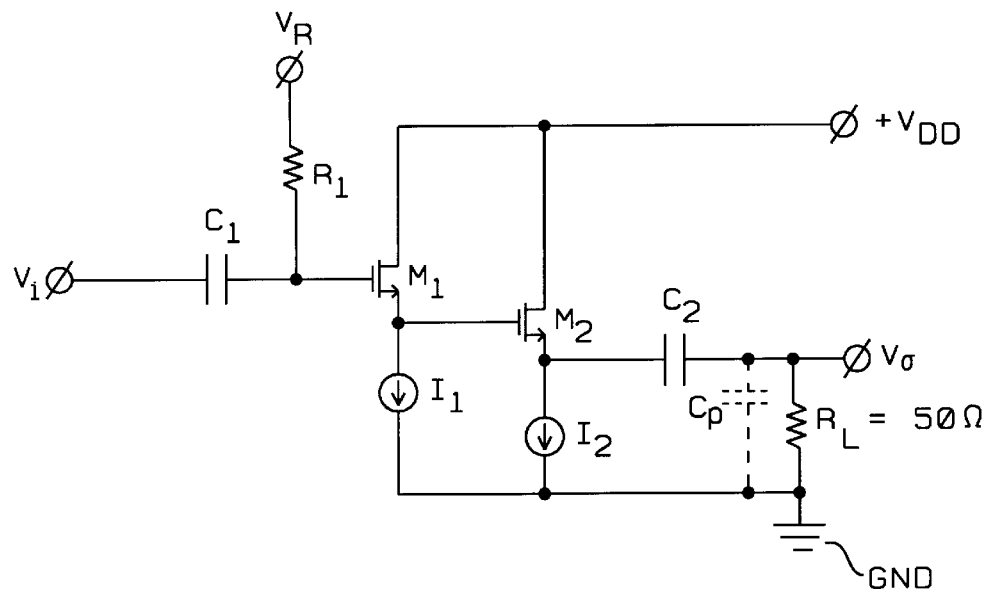
FIG. 1 - Prior Art
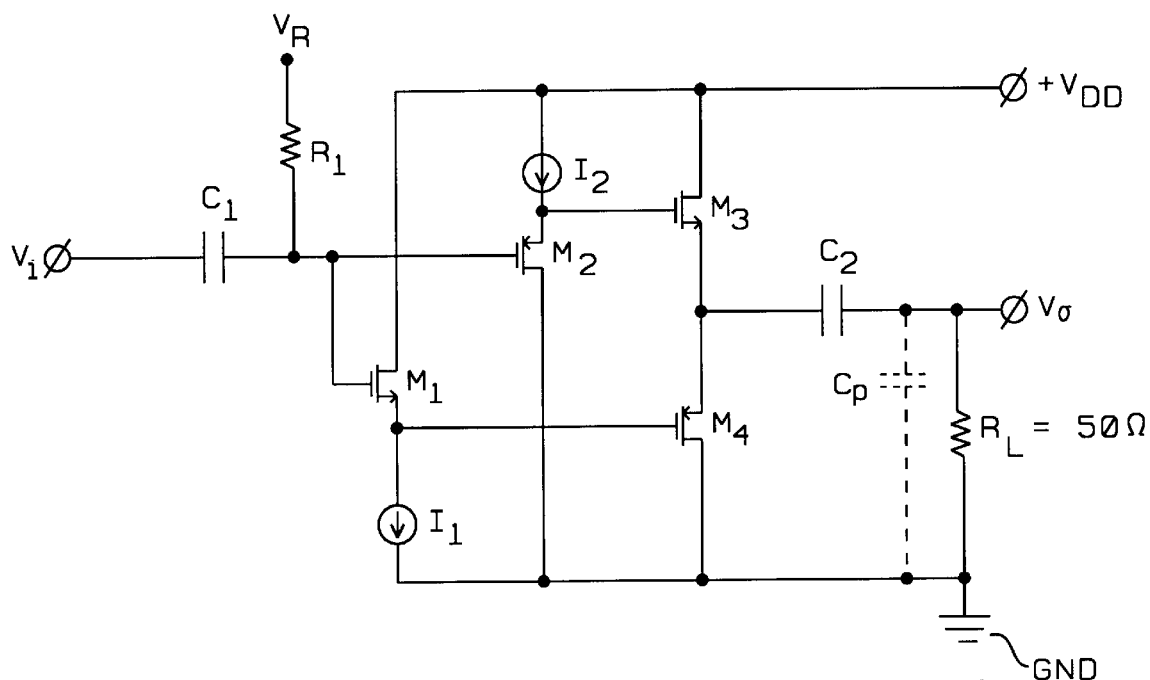
FIG. 2 - Prior Art

INDUCTOR-LESS RF/IF CMOS BUFFER FOR 50Ω OFF-CHIP LOAD DRIVING

BACKGROUND OF THE INVENTION

1. Field of the Invention

The invention relates to CMOS integrated semiconductor circuits, and more particularly to a 50Ω analog buffer amplifier operating in the RF/IF frequency range which avoids using external inductors.

2. Description of the Related Art

Despite the many buffer amplifier designs of the related art, CMOS equivalents of bipolar buffer amplifiers, like the Darlington or the class AB circuit, tend to be inferior. We will demonstrate this point by examining a CMOS equivalent of the "Darlington pair" buffer amplifier in FIG. 1, and a CMOS equivalent class AB buffer amplifier in FIG. 2.

FIG. 1 shows an NMOS transistor M1 coupled in series with a current source $I_1$ coupled between a positive voltage supply $V_{DD}$ and ground (GND). The gate of $M_1$ is coupled via capacitor $C_1$ to input $v_i$ and via resistor $R_1$ to another voltage supply $V_R$. Similarly coupled between $V_{DD}$ and ground is a second NMOS transistor $M_2$ in series with a second current source $I_2$. The gate of $M_2$ is coupled to the source of $M_1$, and the source of $M_2$ is coupled via a second capacitor $C_2$ to output $V_o$. $C_p$ is the total parasitic capacitance of the pad, pin and printed circuit board (PCB) and $R_L$ is the external load, typically 50 ohm.

However, the CMOS version does not work as well as the bipolar one. The expression for voltage gain of the circuit in FIG. 1, where $g_{m2}$ is the transconductance of $M_2$, is given by $$Av = \frac{v_o}{v_i} \cong \frac{g_{m2}R_L}{1+g_{m2}R_L} \quad (1)$$

From (1) we can easily see that to achieve Av=1, it is necessary to have $g_{m2}R_L \gg 1$. This is a very difficult requirement—even in sub-micron CMOS—since $g_{m2}$ must be very high as $R_L$ is equal to 50Ω only. Very large sizes for $M_2$ and very large values for $I_2$ are required to achieve this. Such transconductances, however, are much more easily achievable with bipolar devices. In CMOS technology this circuit usually has a voltage gain that is substantially less than unity while driving 50Ω.

FIG. 2 shows a four transistor CMOS equivalent of a bipolar class AB push-pull buffer amplifier. The section from input $v_i$ to $M_1$, $I_1$ is identical to that of FIG. 1. However, $M_2$ is a PMOS transistor which has its source coupled via $I_2$ to $+V_{DD}$. The drain of $M_2$ is connected to ground and its gate it coupled to the gate of $M_1$. $M_1$ and $M_2$ drive a CMOS output stage comprising NMOS transistor $M_3$ and PMOS transistor $M_4$ coupled between $+V_{DD}$ and ground. The gate of $M_3$ connects to the source of $M_2$ and the gate of $M_4$ connects to the source of $M_1$. The junction of $M_3$ and $M_4$ couples via $C_2$ to output $v_o$. Coupled between the output and ground are $C_p$ and the load $R_L$ as described in FIG. 1 above.

In these and subsequent figures, like parts are identified by like numerals or characters.

This circuit is superior to that in FIG. 1 in some respects. The quiescent current can be low, the sizes of the output transistors $M_3$ and $M_4$ can also be smaller. However the disadvantages are as follows. Firstly, the signal swing is limited at the output to $V_{DD} - (V_{GS4} + V_{GS3})$ compared to $V_{DD} - V_{GS2}$ in FIG. 1. Since $V_{GS}$ is of the order of 1V, this is a substantial loss with $V_{DD}$=3V which is quite common for deep sub-micron CMOS technology. Secondly, the DC voltage at the sources of $M_3$, $M_4$, designed to be equal to $V_R = V_{DD}/2$, may not be realised in practice because of $V_{GS}$ mismatches of $M_1$, M2, M3 and $M_4$. This further degrades the output signal swing of the buffer. Thirdly, neither can this circuit achieve unity voltage gain, when realised with source followers similar to the circuit in FIG. 1.

A patent search revealed the following U.S. Patents relating to buffer amplifiers: U.S. Pat. No. 6,052,028 (Heaton), U.S. Pat. No. 4,495,471 (Barrett), U.S. Pat. No. 4,471,319 (Metz), and U.S. Pat. No. 4,390,852 (Addis), describe Bipolar and FET buffer amplifiers for different applications. U.S. Pat. No. 5,111,157 (Komiak) describes a buffer with MOS devices but uses a complicated circuit with several inductors. U.S. Pat. No. 5,959,475 (Zomorrodi) and U.S. Pat. No. 5,668,500 (LeFevre) describe CMOS buffers but they are complicated and for a different application. U.S. Pat. No. 5,877,634 (Hunley) discloses a CMOS buffer with a controlled slew rate at the output. The circuit uses a differential circuit for feedback but is otherwise different.

None of the related art satisfies the requirement to provide a 50Ω analog buffer amplifier operating in the RF/IF frequency range (typically 100 MHz–2 GHz) which can be integrated in a CMOS technology because it is difficult to integrate inductors for such frequencies when external inductors are to be avoided. The only off-chip components are the 50Ω load resistor and its coupling capacitor.

SUMMARY OF THE INVENTION

It is an object of at least one embodiment of the present invention to provide a method and circuits for an analog buffer amplifier operating into a 50 ohm load and in the radio frequency/intermediate frequency (RF/IF) range of typically 100 MHz to 2 GHz (MHz=$10^6$ hertz, GHz=$10^9$ hertz).

It is another object of the present invention to integrate this analog buffer amplifier in a CMOS technology.

It is yet another object of the present invention to eliminate inductors from the integrated circuit of the analog buffer amplifier.

It is still another object of the present invention to eliminate the need for external inductors.

It is a further object of the present invention is to achieve a voltage gain of one or better.

It is yet a further object of the present invention is to avoid using very large transistors and large current sources.

It is still a further object of the present invention is to provide a large signal swing.

These and many other objects have been achieved by providing buffer amplifier comprising a source-follower plus common drain stage with a feedback path from the output of the common drain stage to the input gate of the source follower stage. The feedback circuit is designed such that the output of the common drain stage can be guaranteed to be at a voltage midway between the positive and the negative voltage supply of the circuit. This is the optimum operating point since it allows the largest signal swing. The transconductance of the feedback amplifier must be small, because the output coupling capacitor cannot be made any smaller to ensure stability of the feedback loop. A small transconductance is realized by biasing the transistors of the feedback amplifier with very low currents; such as by operating them in the weak inversion region. In addition, the transistors of the feedback amplifier can be dimensioned in such a way as to reduce the transconductance even further. Another important fact is that the feedback through the feedback amplifier is only present at DC (direct current) and a very low frequencies. This stabilizes the DC voltage at the drain of the common drain transistor, which, via an output capacitor, is also the output of the buffer amplifier.

These and many other objects and advantages of the present invention will be readily apparent to one skilled in the art to which the invention pertains from a perusal of the claims, the appended drawings, and the following detailed description of the preferred embodiments.

BRIEF DESCRIPTION OF THE DRAWINGS

FIG. 1 is a circuit diagram of a bipolar Darlington pair buffer amplifier of the prior art.

FIG. 2 is a CMOS equivalent of a bipolar class AB push-pull buffer amplifier of the prior art.

DESCRIPTION OF THE PREFERRED EMBODIMENT

Figure 3:
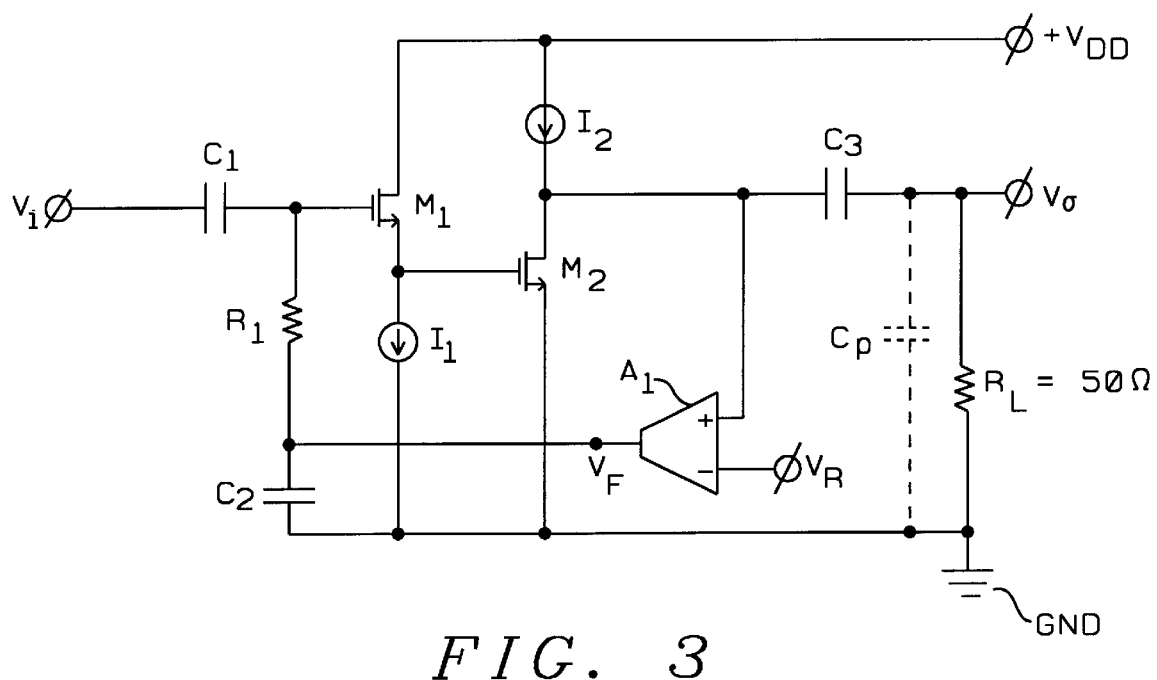
FIG. 3 is a high level circuit diagram of the preferred embodiment of the buffer amplifier of the present invention.

FIG. 3 depicts the basic idea of the invention. The inductor-less RF/IF CMOS buffer comprises a source follower stage with a first NMOS transistor $M_1$ and a common drain stage with a second NMOS transistor $M_2$. $M_1$ is coupled in series with a first current source $I_1$, where the drain of $M_1$ is coupled to $+V_{DD}$, the positive voltage supply. The other side of $I_1$ is couple to ground (the negative voltage supply). The gate of $M_1$ is coupled via a first capacitor $C_1$ to input $v_i$. A series combination of resistor $R_1$ and a second capacitor $C_2$ is coupled between the gate of $M_1$ and ground. A series combination of a second current source $I_2$ and a second NMOS transistor $M_2$ is coupled between $+V_{DD}$ and ground. The gate of $M_2$ is coupled to the source of $M_1$. The drain of $M_2$, coupled to $I_2$, is also coupled via a third capacitor $C_3$ to output $v_o$. $C_p$ is the total parasitic capacitance of the pad, pin and printed circuit board (PCB). $A_1$ is an operational transconductance amplifier (OTA) having a positive and a negative input. The positive input of $A_1$ is coupled to the drain of $M_2$ and the negative input of $A_1$ is coupled to a voltage supply $V_R$. The output $V_F$ of $A_1$ is coupled to the junction of $R_1$ and $C_2$. The external load $R_L$ of typically 50 ohm is connected between output $V_o$ and ground. The CMOS buffer can provide unity gain at a signal frequency response $f_s$ of 100 MHz to 2 GHz (MHz=$10^6$ hertz, GHz=$10^9$ hertz) with $R_L$ ranging from 40 to 60 ohm. $C_1$ is the input coupling capacitor, $C_3$ is the output coupling capacitor, and $C_2$ is the compensating capacitor for the feedback path formed by $M_1$, $M_2$, $A_1$ and $R_1$. The bias current of $M_2$ and $M_1$ is set by $I_2$ through the drain and by $I_1$ through the source, respectively. The feedback path adjusts the DC gate voltage of $M_1$ such that the DC drain voltage of $M_2$ is set precisely equal to $V_R$. I.e., the direct current (DC) voltage at the drain of transistor $M_2$ is determined by OTA $A_1$ to be essentially equal to voltage supply $V_R$. The best value for $V_R$ is exactly $V_{DD}/2$ (when the negative voltage supply is ground, else it is the midway point between the positive and negative voltage supply), as this will allow maximum signal swing at the output. The maximum output swing is $V_{DD}-2V_D$sat which is a substantial improvement over the two prior arts, described above, since $V_D$sat can be made as low as 0.3V.

Assuming that the voltage gain of the source follower $M_1$ is nearly unity, the gain for the overall buffer is given by:

$$Av = \frac{v_o}{v_i} \cong g_{m2}R_L \qquad (2)$$

For Av=1, from (2), we need to have $g_{m2}R_L$=1. This is a much less stringent requirement compared to that of FIG. 1 and FIG. 2 where $g_{m2}R_L$>>1 is required. In fact, it is not difficult to obtain some voltage gain to offset any loss at the source follower $M_1$ or for other purposes.

The stability requirement for the feedback loop is given by:

$$\frac{C_2}{C_3} \geq [g_{m2}r_{o2}][g_{ma}(R_L + r_{o2})] \qquad (3)$$

Figure 6:
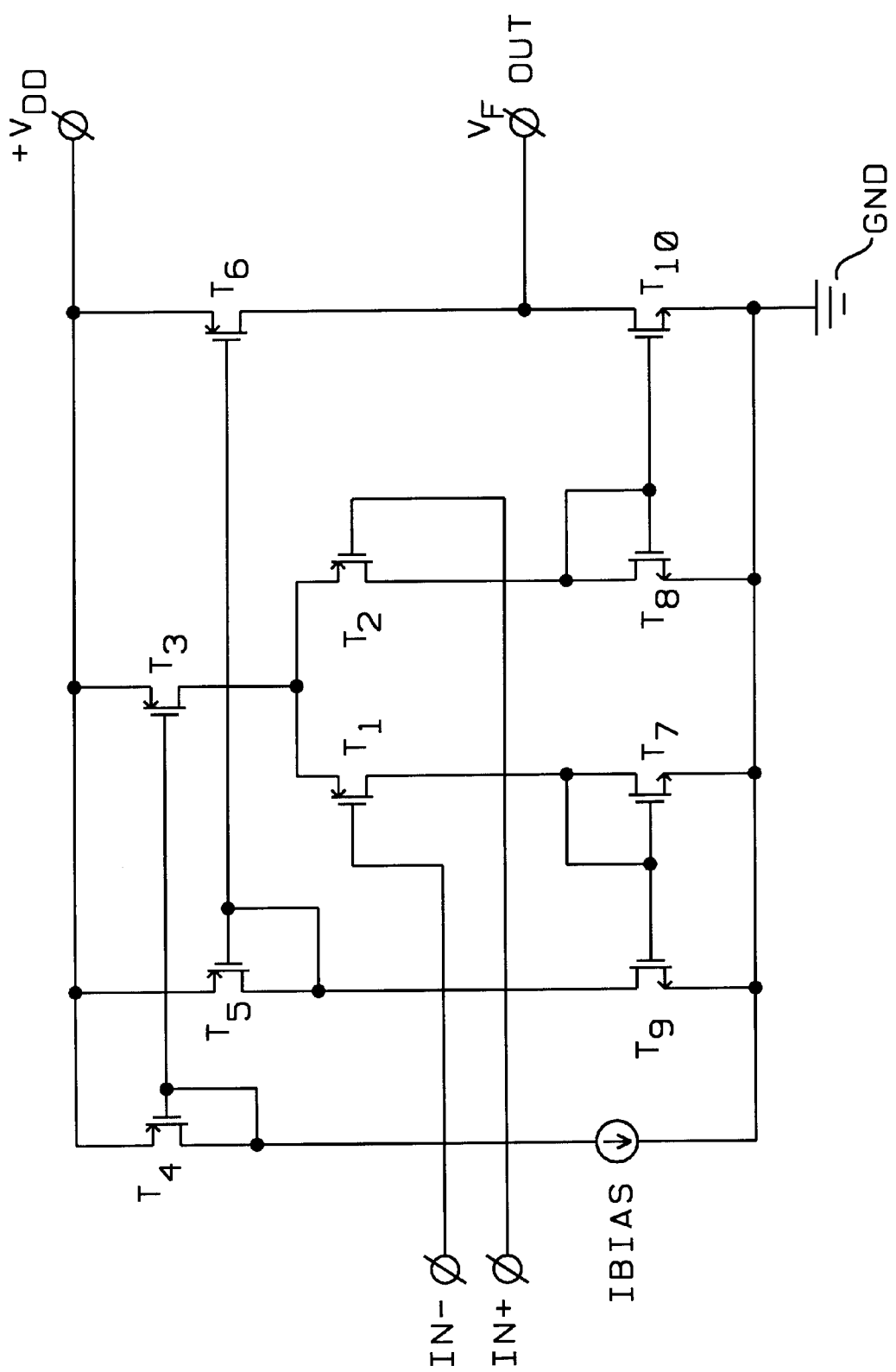
FIG. 6 is a circuit diagram of a preferred embodiment of the operational transconductance amplifier (OTA) of the present invention as used in FIGS. 3, 4, and 5.

Here, $r_{o2}$ is the equivalent resistance looking into the drain of $M_2$ (without $R_L$), $g_{ma}$ is the transconductance of $A_1$. From (3) we see that, for reasonably small values of $C_2$, $C_3$ and $g_{ma}$ must be as small as possible. Since $C_3$ cannot be made very small, $g_{ma}$ will have to be made so by biasing the internal transistors of $A_1$ (shown in FIG. 6 and discussed below) with very low currents—operating in weak-inversion, if required. In FIG. 6, usually, $T_9$, $T_7$, $T_8$ and $T_{10}$ are identical transistors. So are $T_5$, $T_6$ and also $T_1$, $T_2$. However, by altering the circuit such that (W/L)$_9$: (W/L)$_7$= (W/L)$_{10}$: (W/L)$_8$=1: N, it is possible to reduce $g_{ma}$ by N times, N being an integer.

Referring back to FIG. 3, the values of the coupling capacitors $C_1$ and $C_3$ are determined from:

$$C_1 > \frac{1}{2\pi R_1 f_s} \quad \text{and} \quad C_3 > \frac{1}{2\pi R_L f_s} \qquad (4)$$

where $f_s$ is the signal frequency (100MHz–2 GHz).

The DC gain $A_{DC}$ and the unity-gain bandwidth $f_o$ of the feedback loop is given $$A_{DC} \cong [g_{m2}r_{o2}][g_{ma}r_{oa}] \qquad (5)$$

$$f_0 \cong \frac{[g_{m2}r_{o2}][g_{ma}]}{2\pi C_2} \qquad (6)$$

where $r_{oa}$ is the output resistance of the $A_1$. Since $g_{ma}$ has to be made low, $r_{oa}$ should be made as high as possible to maintain a reasonably high value of $A_{DC}$ for accuracy of the feedback loop. However, this is easily achieved, even if the transistors of $A_1$ are operated with very low currents, since the output impedance is inversely proportional to the current.

Another important fact to note is that the feedback through $A_1$ is only present at DC and at very low frequencies. This stabilizes the DC voltage at the drain of $M_2$. However, at signal frequencies, $A_1$ and $C_2$ form a $g_m$-C low-pass filter—as given by (6)13 which essentially removes the feedback so that the required gain as in (2) can be obtained. The resistor $R_1$ provides the input impedance.

Figure 4:
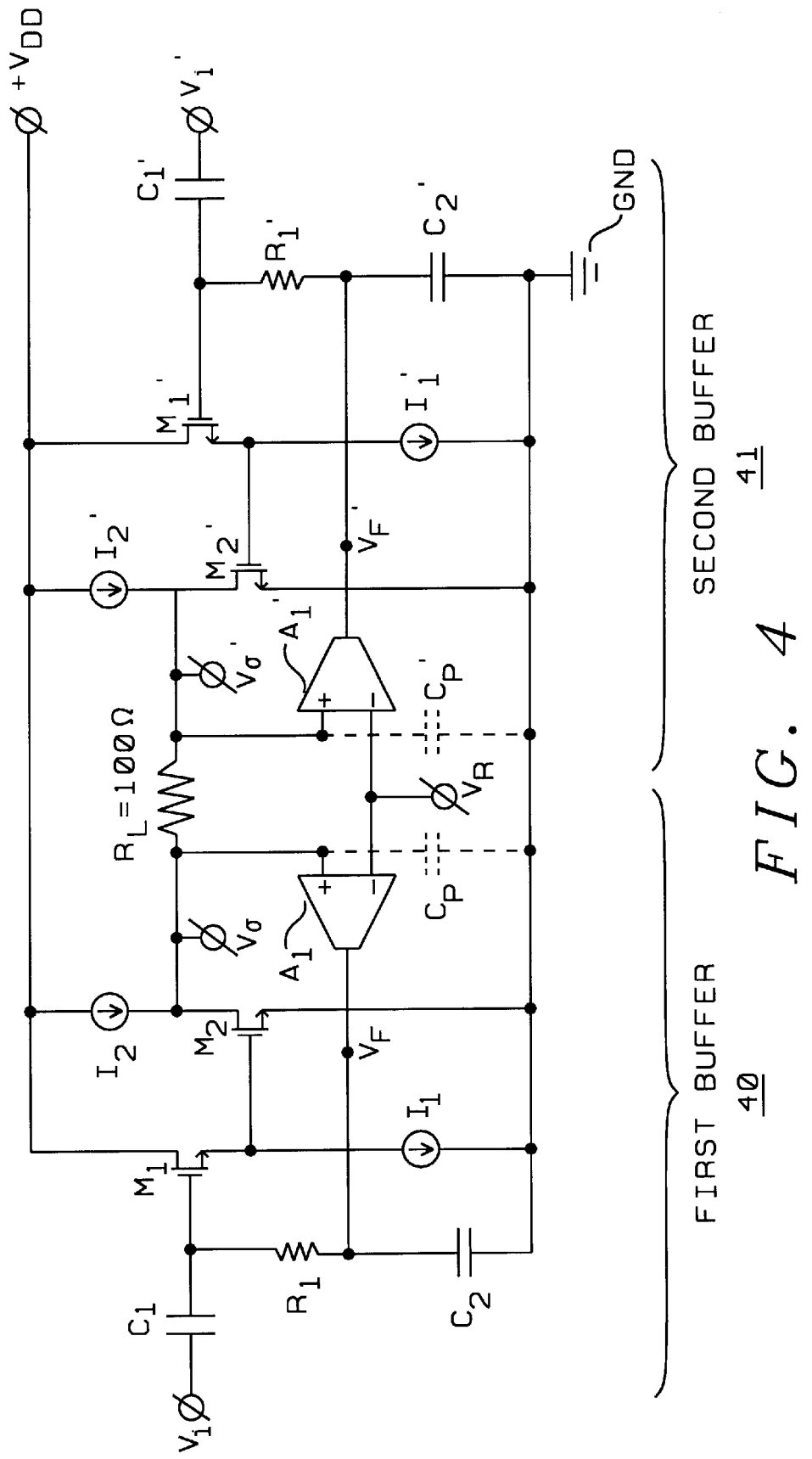
FIG. 4 is a high level circuit diagram of the preferred embodiment of the differential buffer amplifier of the present invention.

FIG. 4 shows a differential CMOS buffer driving $R_L$=100Ω. In the figures like parts are identified by like designations. In this case, no coupling capacitor to the load is required. To operate at such high frequencies, it is inevitable that one will have to use the minimum channel length permitted by the technology for $M_1$ and $M_2$. However, the current sources $I_1$ and $I_2$ will be implemented, as in FIG. 5 discussed below, with transistors having long channel length for accuracy of the bias currents. It is not difficult to see that for the circuit topologies of FIG. 3 and FIG. 4, the bias voltages and currents of $M_1$ and $M_2$, and, therefore, the performance of the buffer is almost unaffected by the unavoidable inaccuracies in etching of the minimum channel length during fabrication.

The differential CMOS buffer of FIG. 4 comprises a first buffer 40 and a second buffer 41. Buffers 40 and 41 are both identical with the CMOS buffer of FIG. 3 and confer the same advantages to the differential CMOS buffer. The only difference is that the coupling capacitor $C_3$ is omitted and that the load resistor $R_L$ is connected between the two outputs $v_o$ and $v_o'$. Components of buffer 41 are identified by having their designations 'primed'. The differential CMOS buffer of FIG. 4 provides unity gain at a signal frequency response $f_s$ of 100 MHz to 2 GHz where $R_L$ is typically 100 ohm, but which may range from 80 to 120 ohm.

Figure 5:
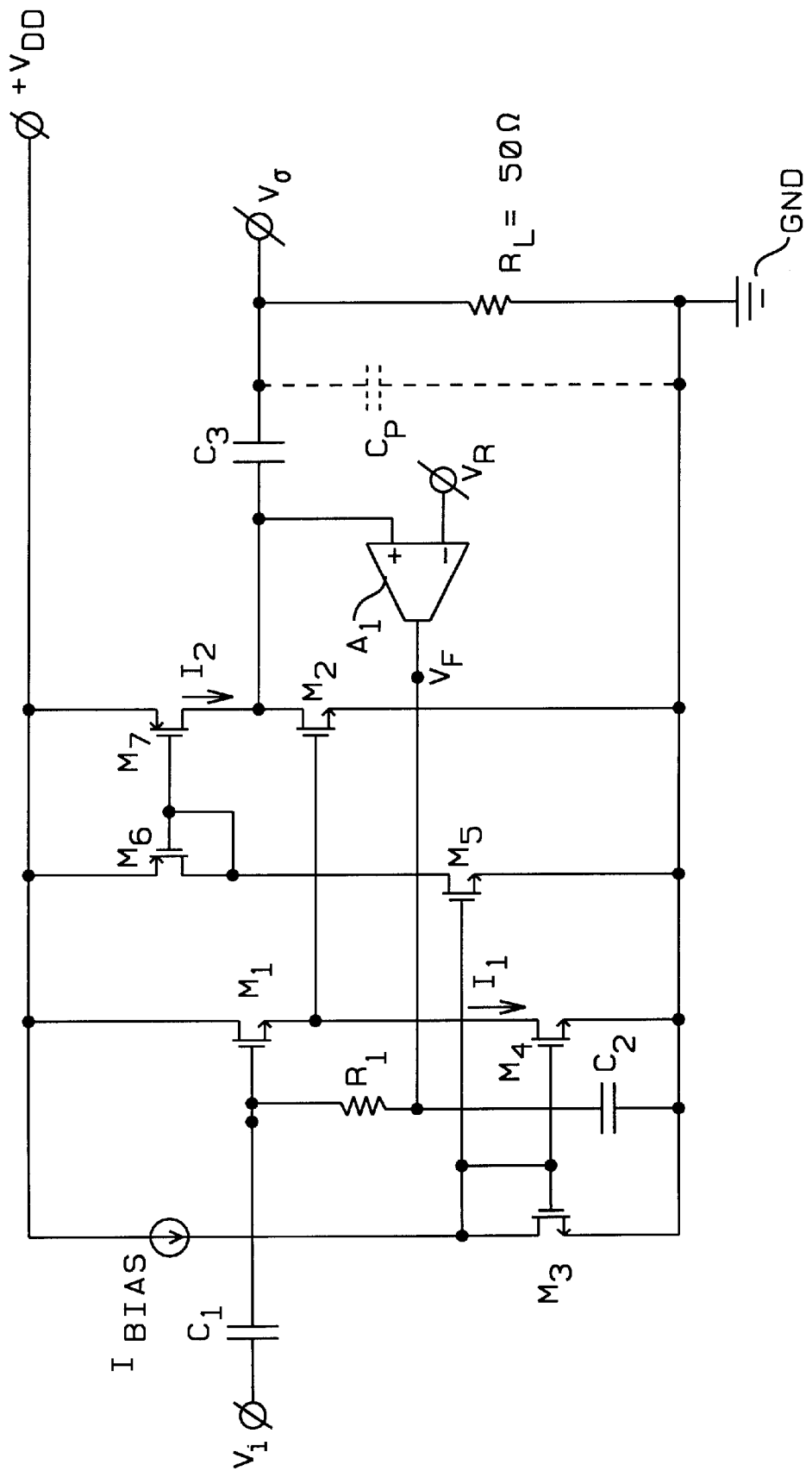
FIG. 5 is a more detailed circuit diagram of the preferred embodiment of the buffer amplifier of FIG. 3.

In FIG. 5 is the same circuit as that of FIG. 3, but current sources $I_1$ and $I_2$ are shown implemented with transistor as follows. Current source $I_1$, comprises NMOS transistors $M_3$ and $M_4$. The gate of $M_4$ is coupled to the gate and the drain of $M_3$, both sources of $M_3$ and $M_4$ are coupled to ground (negative voltage supply). The drain of $M_3$ is coupled to current source IBIAS, and the drain of $M_4$ is coupled to the source of $M_1$. The gate of $M_5$ is coupled to the gate of $M_3$ and the source of $M_5$ is coupled to ground. Current source $I_1$ comprises PMOS transistors $M_5$, $M_6$, and $M_7$. The gate of $M_7$ is coupled to the gate and the drain of $M_6$, both sources of $M_6$ and $M_7$ are coupled to the positive voltage supply $+V_{DD}$. The drain of $M_6$ is coupled to the drain of $M_5$, and the drain of $M_7$ is coupled to the drain of $M_2$.

We now describe one possible and preferred implementation of the operational transconductance amplifier (OTA) $A_1$ as illustrated in FIG. 6:

First and second PMOS transistor $T_1$ and $T_2$ are a differential transistor pair, where the gates of $T_1$, $T_2$ are coupled to the negative and positive input IN−, IN+, respectively, and where the sources of $T_1$, $T_2$ are joined.

A first current source CS1 comprises NMOS transistors $T_7$ and $T_9$. The gate and drain of $T_7$ are connected to the gate of $T_9$. The source of $T_9$ is coupled to the negative voltage supply. The drain-source path of $T_7$ is coupled between the drain of $T_1$ and the negative voltage supply, respectively.

A second current source CS2 comprises NMOS transistors $T_8$ and $T_{10}$. The gate and drain of $T_8$ are connected to the gate of $T_{10}$. The drain-source path of $T_{10}$ is coupled between output $V_F$ and the negative voltage supply, respectively. The drain-source path of $T_8$ is coupled between the drain of $T_2$ and the negative voltage supply, respectively.

A third current source CS3 comprises PMOS transistors $T_3$ and $T_4$. The gate and the drain of $T_4$ are connected to the gate of $T_3$. The source-drain path of $T_3$ is coupled between the positive voltage supply $(+V_{DD})$ and the junction of the sources of $T_1$ and $T_2$, respectively, and the source of $T_4$ is connected to the positive voltage supply.

A current source IBIAS is coupled with one terminal to the drain of $T_4$ and with the other terminal to the negative voltage supply.

A fourth current source CS4 comprises PMOS transistors $T_5$ and $T_6$. The gate and the drain of $T_5$ are connected to the gate of $T_6$. The source-drain path of $T_5$ is coupled between the positive voltage supply an the drain of $T_9$, respectively, and the source-drain path $T_6$ is coupled between the positive voltage supply and output $V_F$, respectively.

Figure 7:
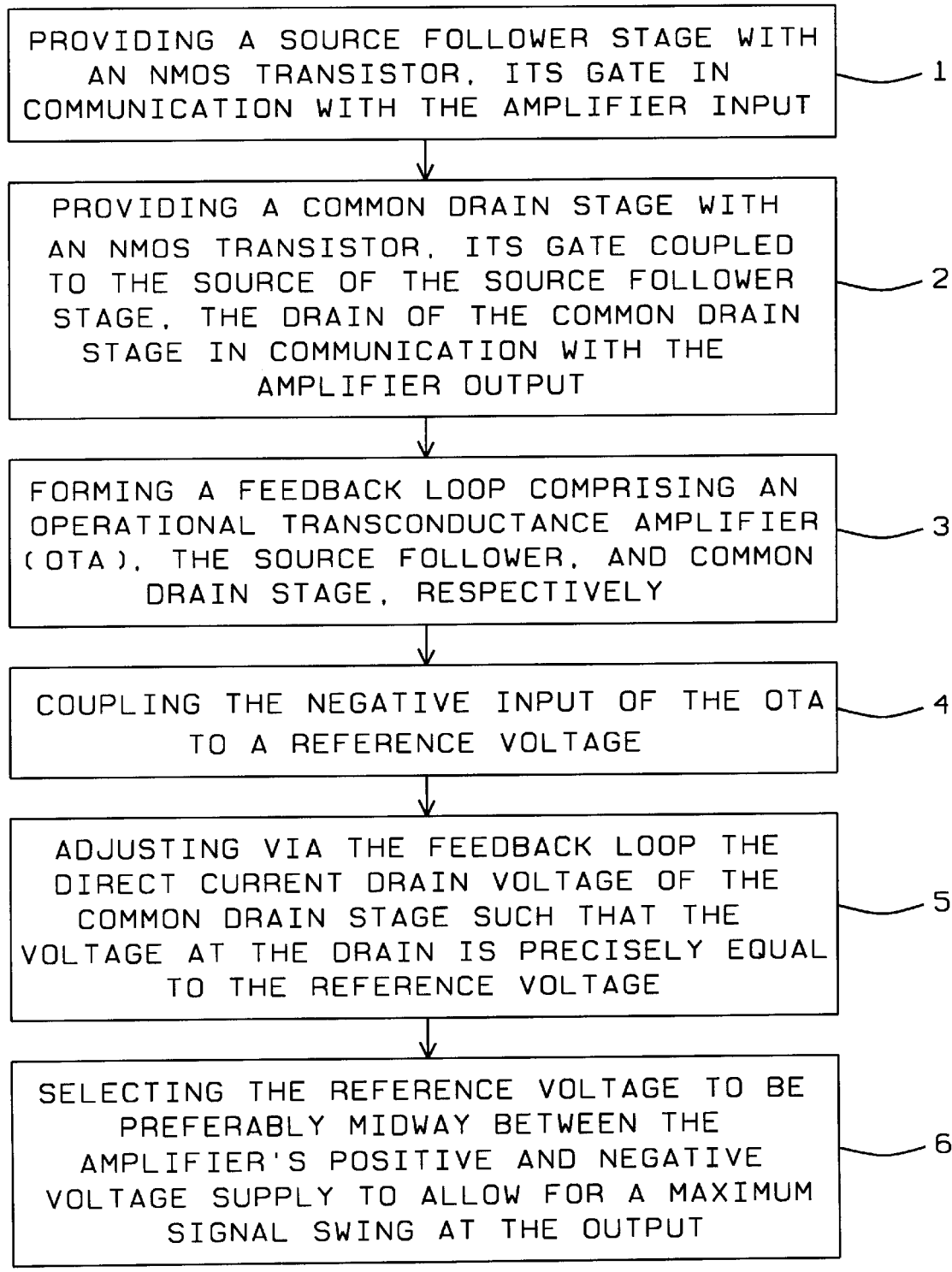
FIG. 7 is a block diagram of the preferred method of the present invention.

With reference to FIG. 7, Blocks 1 to 6, we describe below the preferred method of providing an inductor-less CMOS buffer amplifier with feedback, using the steps of:

a) providing a source follower stage with a first NMOS transistor, its gate in communication with the input of the CMOS buffer amplifier, its source coupled to a first current source, b) providing a common drain stage with a second NMOS transistor, its gate coupled to the source of the first NMOS transistor, the drain of the second NMOS transistor in communication with an output, c) coupling the drain of the second NMOS transistor via a second current source to a positive voltage supply, d) forming a feedback loop by coupling the positive input of an operational transconductance amplifier (OTA) to the drain of the second NMOS transistor and coupling the output of the OTA via resistive means to the gate of the first NMOS transistor, e) coupling the negative input of the OTA to a reference voltage, coupling the output of the OTA via capacitive means to a negative voltage supply, where the capacitive means together with the OTA form a low pass filter, g) adjusting via the feedback loop the direct current drain voltage of the second NMOS transistor such that the voltage at the drain of the second NMOS transistor is precisely equal to the reference voltage, and h) preferably selecting the reference voltage to be midway between the positive and negative voltage supply to allow for a maximum signal swing at the output.

The advantage of this method is that the feedback loop is only present at direct current (DC) or low frequencies. Transistors of the OTA are preferably operated in their weak inversion region. The above described method provides a CMOS buffer amplifier which can drive a 50 ohm load at unity gain with a signal frequency response ranging from 100 MHz to 2,000 MHz (MHz=$10^6$ Hertz).

SIMULATION RESULTS

Using some numerical values from simulation at 400 MHz, $I_1$=250 mA, $I_2$=3 mA, $R_1$=15 KΩ, $C_1$=1 pF, $C_2$=10 pF, $C_3$=100 pF, $g_{m2}$=20 mS, $r_{o2}$=1 KΩ. $g_{ma}$=1 μS, $r_{oa}$=500 MegΩ. With these values, we can see that (3) and (4) are satisfied and (5) and (6) yield $A_{DC}$=80 dB and $f_o$=320 KHz which are close to the respective simulation values of 75 dB and 270 KHz. The phase margin in simulation is 70°.

In summary, the advantages of the present invention are:

1) an inductor-less buffer amplifier which can be integrated in CMOS 2) capable of driving at unity gain a 50 ohm off chip load, or a 100 ohm load for the differential version 3) capable of operating in the RF/IF frequency range of 100 MHz to 2 GHz 4) providing a large signal swing (rail to rail minus about 0.6 Volt)

While the invention has been particularly shown and described with reference to the preferred embodiments thereof, it will be understood by those skilled in the art that various changes in form and details may be made without departing from the spirit and scope of the invention.

What is claimed is:

1. An inductor-less CMOS buffer with feedback, comprising:
   a buffer circuit with an input $v_i$ and an output $v_o$, applying an input signal at said input $v_i$ and providing a buffered output signal at said output $v_o$, said buffer circuit further comprising:
   a positive and a negative voltage supply;
   a first NMOS transistor, having a drain-source path and a gate, in communication with said positive voltage supply and said negative voltage supply, the gate of said first NMOS transistor in communication with said input $v_i$;
   a first current source coupled between the source of said first NMOS transistor and said negative voltage supply;
   a second NMOS transistor, having a drain-source path and a gate, in communication with said positive voltage supply and said negative voltage supply, the gate of said second NMOS transistor coupled to the source of said first NMOS transistor and said first current source;
   a second current source coupled between said positive voltage supply and the drain of said second NMOS transistor, said second current source thereby biasing said second NMOS transistor;
   where the drain of said second NMOS transistor is in communication with said output $v_o$, said output $v_o$ capable of driving a load ranging from 40 to 60 ohm at unity gain; and
   an operational transconductance amplifier (OTA) with a transconductance $g_{ma}$, having a positive and a negative input, and an output $V_F$, said OTA providing at said output $V_F$ the amplified difference between voltages applied to said positive and said negative input, said OTA forming part of a feedback path from the drain of said second NMOS transistor to the gate of said first NMOS transistor, said positive input coupled to the drain of said second NMOS transistor, said negative input coupled to a voltage supply $V_R$, and said output $V_F$ of said OTA in communication with the gate of said first NMOS transistor.

2. The CMOS buffer of claim 1, wherein a first capacitive means is coupled between said input $v_i$ and the gate of said first NMOS transistor.

3. The CMOS buffer of claim 1, wherein a first resistive means in series with a second capacitive means is coupled between the gate of said first NMOS transistor and said negative voltage supply, where said second capacitive means is part of said feedback path.

4. The CMOS buffer of claim 1, wherein a third capacitive means is coupled between the drain of said second NMOS transistor and said output $v_o$.

5. The CMOS buffer of claim 1, wherein a signal frequency response of said CMOS buffer ranges from 100 MHz to 2,000 MHz (MHz=$10^6$ Hertz).

6. The CMOS buffer of claim 1, wherein a direct current (DC) voltage at the drain 40 of said second NMOS transistor is determined by said OTA to be essentially equal to said voltage supply $V_R$, where said voltage supply $V_R$ preferably is exactly midway between the voltage of said positive voltage supply and said negative voltage supply.

7. The CMOS buffer of claim 1, wherein a direct current (DC) biases for said first and said second NMOS transistors are determined accurately through the circuit topology of said CMOS buffer.

8. The CMOS buffer of claim 7, wherein the CMOS buffer performance is, therefore, unaffected by inaccuracies in etching of the minimum channel length of said first and said second NMOS transistors during fabrication.

9. The CMOS buffer of claim 1, wherein said OTA further comprises:
   a first and a second PMOS transistor T1 and T2, respectively, each of said transistors T1 T2 having a source-drain path and a gate, said transistors T1, T2 arranged as a differential pair, the gates of said transistors T1, T2 coupled to said negative and said positive input, respectively, where the sources of said transistors T1, T2 are joined, and where the drains of said transistors T1, T2 are in communication with said negative voltage supply;
   a first current source controlled by the current in the drain of said transistor T1;
   a second current source controlled by the drain current of said transistor T2;
   a third current source controlled by the current of current source IBIAS, said current source IBIAS coupled between said positive and said negative voltage supplies;
   said third current source coupled between said positive voltage supply and said sources of said transistors T1, T2;
   a fourth current source controlled by said first current source;
   said fourth current source in series with said second current source and coupled between said positive and said negative voltage supplies, respectively; and
   said output $V_F$ coupled to the junction of said fourth and said second current source.

10. The CMOS buffer of claim 9, wherein said PMOS transistors T1 and T2 in the OTA have identical channel dimensions.

11. The CMOS buffer of claim 9, wherein said PMOS transistors T1 and T2 in the OTA are operated in their weak inversion region.

12. An inductor-less differential CMOS buffer with feedback, comprising:
   a first buffer circuit with an input $v_i$ and an output $v_o$, applying an input signal at said input $v_i$ and providing a buffered output signal at said output $v_o$, said buffer circuit further comprising:
   a positive and a negative voltage supply;
   a first NMOS transistor, having a drain-source path and a gate, in communication with said positive voltage supply and said negative voltage supply, the gate of said first NMOS transistor in communication with said input $v_i$;
   a first current source coupled between the source of said first NMOS transistor and said negative voltage supply;
   a second NMOS transistor, having a drain-source path and a gate, in communication with said positive voltage supply and said negative voltage supply, the gate of said second NMOS transistor coupled to the source of said first NMOS transistor and said first current source;
   a second current source coupled between said positive voltage supply and the drain of said second NMOS transistor, said second current source thereby biasing said second NMOS transistor;
   where the drain of said second NMOS transistor is in communication with said output $v_o$;
   an operational transconductance amplifier (OTA) with a transconductance $g_{ma}$, having a positive and a negative input, and an output $V_F$, said OTA providing at said output $V_F$ the amplified difference between voltages applied to said positive and said negative input, said OTA forming part of a feedback path from the drain of said second NMOS transistor to the gate of said first NMOS transistor, said positive input coupled to the drain of said second NMOS transistor, said negative input coupled to a voltage supply $V_R$, and said output $V_F$ of said OTA in communication with the gate of said first NMOS transistor; and a second buffer circuit with an input $v_i'$ and an output $v_o'$, applying an input signal at said input $v_i'$ and providing a buffered output signal at said output $v_o'$, where said second buffer circuit is identical to said first buffer circuit, where said input $v_i'$ equals said input $v_i$, and said output $v_o'$ equals said output $v_o$.

13. The differential CMOS buffer of claim 12, wherein the output of said differential CMOS buffer, from said output $v_o$ to said output $v_o'$, is capable of driving a load ranging from 80 to 120 ohm at unity gain.

14. The differential CMOS buffer of claim 12, wherein a first capacitive means is coupled between said input $v_i$ and the gate of said first NMOS transistor.

15. The differential CMOS buffer of claim 12, wherein a first resistive means in series with a second capacitive means is coupled between the gate of said first NMOS transistor and said negative voltage supply, where said second capacitive means is part of said feedback path.

16. The differential CMOS buffer of claim 12, wherein a direct current (DC) voltage at the drain of said second NMOS transistor is determined by said OTA to be essentially equal to said voltage supply $V_R$, where said voltage supply $V_R$ preferably is exactly midway between the voltage of said positive voltage supply and said negative voltage supply.

17. The differential CMOS buffer of claim 12, wherein a direct current (DC) biases for said NMOS transistors M1 and M2 are determined accurately through the circuit topology of said CMOS buffer.

18. The differential CMOS buffer of claim 17, wherein the CMOS buffer performance is, therefore, unaffected by inaccuracies in etching of the minimum channel length of said first and said second NMOS transistors M1, M2 during fabrication.

19. The differential CMOS buffer of claim 12, wherein said OTA further comprises:
a first and a second PMOS transistor T1 and T2, respectively, each of said transistors T1, T2 having a source-drain path and a gate, said transistors T1, T2 arranged as a differential pair, the gates of said transistors T1, T2 coupled to said negative and said positive input, respectively, where the sources of said transistors T1, T2 are joined, and where the drains of said transistor T1, T2 are in communication with said negative voltage supply;
a first current source controlled by the current in the drain of said transistor T1;
a second current source controlled by the drain current of said transistor T2;
a third current source controlled by the current of current source IBIAS, said current source IBIAS coupled between said positive and said negative voltage supplies;
said third current source coupled between said positive voltage supply and said sources of said transistors T1, T2;

a fourth current source controlled by said first current source;
said fourth current source in series with said second current source and coupled between said positive and said negative voltage supplies, respectively; and
said output $V_F$ coupled to the junction of said fourth and said second current source.

20. The different CMOS buffer of claim 19, wherein said PMOS transistors T1 and T2 of said OTA identical channel dimensions.

21. The OTA of claim 19, wherein said PMOS transistors T1 and T2 are operated in their weak inversion region.

22. An inductor-less CMOS buffer with feedback, comprising:
a positive and a negative voltage supply;
a first current source to provide a bias current $I_1$, said first current source further comprising:
an NMOS transistor M3, having a drain-source path and a gate, the gate and drain of said transistor M3 coupled together, the source of said transistor M3 coupled to said negative voltage supply;
an NMOS transistor M4, having a drain-source path and a gate, the gate of said transistor M4 coupled to the drain of said transistor M3, the source of said transistor M4 coupled to said negative voltage supply;
an NMOS transistor M5, having a drain-source path and a gate, the gate of said transistor M5 coupled to the drain of said transistor M3, the source of said transistor M5 coupled to said negative voltage supply;
a current source IBIAS coupled between said positive voltage supply and the drain of said transistor M3;
a buffer circuit with an input $v_i$ and an output $v_o$, applying an input signal at said input $v_i$ and providing a buffered output signal at said output $v_o$, said buffer circuit further comprising:
a first NMOS transistor M1, having a drain-source path and a gate, the drain of said transistor M1 coupled to said positive voltage supply, the gate of said transistor M1 coupled via a first capacitive means C1 to said input $v_i$, and the source of said transistor M1 coupled to the drain of said transistor M4;
a second NMOS transistor M2, having a drain-source path and a gate, the drain of said transistor M2 coupled via a third capacitive means C3 to said output $v_o$, the source of said transistor M2 coupled to said negative voltage supply, the gate of said transistor M2 coupled to the source of said transistor M1;
an RC network comprising a resistive means R1 coupled in series with a second capacitive means C2, said resistive means R1 coupled to the gate of said transistor M1 and said second capacitive means C2 coupled to said negative voltage supply, sad RC network forming part of a feedback circuit from the drain of said transistor M2 to the gate of said transistor M1;
a second current source to provide a bias current $I_2$ for said transistor M2, said second current source further comprising:
a PMOS transistor M6, having a source-drain path and a gate, the gate and drain of said transistor M6 coupled together, the source of said transistor M6 coupled to said positive voltage supply, where the drain of said transistor M6 is coupled to the drain of said transistor M5;
a PMOS transistor M7, having a source-drain path and a gate, the gate of said transistor M7 coupled to the drain of said transistor M6, the source of said transistor M7 coupled to said positive voltage supply, and the drain of said transistor M7 coupled to the drain of said transistor M2;

an operational transconductance amplifier (OTA) with a transconductance $g_{ma}$, having a positive and a negative input, and an output $V_F$, said OTA providing at said output $V_F$ the amplified difference between voltages applied to said positive and said negative input, said OTA forming part of said feedback circuit from the drain of said second NMOS transistor M2 to the gate of said first NMOS transistor, said positive input coupled to the drain of said second NMOS transistor M2, said negative input coupled to a voltage supply $V_R$, and said output $V_F$ of said OTA coupled to the junction between said resistive means R1 and said second capacitive means C2.

23. The CMOS buffer of claim 22, wherein a direct current (DC) voltage at the drain of said second NMOS transistor is determined by said OTA to be essentially equal to said voltage supply $V_R$, where said voltage supply $V_R$ preferably is exactly midway between the voltage of said positive voltage supply and said negative voltage supply.

24. The CMOS buffer of claim 22, wherein a direct current (DC) biases for said NMOS transistors M1 and M2 are determined accurately through the circuit topology of said CMOS buffer.

25. The CMOS buffer of claim 22, wherein said transistors of said first and said second current sources are implemented with long channel lengths for accuracy of said bias currents.

26. The CMOS buffer of claim 25, wherein the CMOS buffer performance is, therefore, unaffected by inaccuracies in etching of the minimum channel length of said first and said second NMOS transistors M1, M2 during fabrication.

27. The CMOS buffer of claim 22, wherein said OTA further comprises:

a first and a second PMOS transistor T1 and T2, respectively, each of said transistors T1, T2 having a source-drain path and a gate, said transistors T1, T2 arranged as a differential pair, the gates of said transistors T1, T2 coupled to said negative and said positive input, respectively, and where the sources of said transistors T1, T2 are joined;

a first current source comprising NMOS transistors T7, T9, each of said transistors T7, T9 having a drain-source path and a gate, where the gate and the drain of said transistor T7 are coupled to the gate of said transistor T9, the source of said transistor T9 coupled to said negative voltage supply, the drain-source path of said transistor T7 coupled between the drain of said transistor T1 and said negative voltage supply, respectively;

a second current source comprising NMOS transistors T8, T10, each of said transistors T8, T10 having a drain-source path and a gate, where the gate and the drain of said transistor T8 are coupled to the gate of said transistor T10, the drain-source path of said transistor T10 coupled between said output $V_F$ and said negative voltage supply, respectively, the drain-source path of said transistor T8 coupled between the drain of said transistor T2 and said negative voltage supply, respectively;

a third current source comprising PMOS transistors T3, T4, each of said transistors T3, T4 having a source-drain path and a gate, where the gate and the drain of said transistor T4 are coupled to the gate of said transistor T3, the source-drain path of said transistor T3 coupled between said positive voltage supply and the junction of the sources of said transistors T1, T2, respectively, the source of said transistor T4 coupled to said positive voltage supply;

a current source IBIAS with a first and a second terminal, said first terminal coupled to the drain of said transistor T4, said second terminal coupled to said negative voltage supply; and a fourth current source comprising PMOS transistors T5, T6, each of said transistors T5, T6 having a source-drain path and a gate, where the gate and the drain of said transistor T5 are coupled to the gate of said transistor T6, the source-drain path of said transistor T5 coupled between said positive voltage supply and the drain of said transistor T9, respectively, and where the source-drain path of said transistor T6 is coupled between said positive voltage supply and said output $V_F$, respectively.

28. The CMOS buffer of claim 27, wherein the channel width-to-length ratio W/L of said transistor T9 over said transistor T7 equals the channel width-to-length ratio W/L of said transistor T10 over said transistor T8 equals the ratio of the numeral 1 over N, where said N is an integer.

29. The CMOS buffer of claim 28, wherein a transconductance $g_{ma}$ is reduced by N times.

30. The CMOS buffer of claim 27, wherein said transistors T5 and T6 of said OTA have identical channel dimensions.

31. The CMOS buffer of claim 27, wherein said PMOS transistors T1 and T2 of said OTA have identical channel dimensions.

32. The CMOS buffer of claim 27, wherein said transistors of said OTA are operated in their weak inversion region.

33. The method of providing an inductor-less CMOS buffer amplifier with feedback, comprising the steps of:

providing a source follower stage with an input and a first NMOS transistor, the gate of said first NMOS transistor in communication with said input, the source of said first NMOS transistor coupled to a first current source;

providing a common drain stage with an output and a second NMOS transistor, the gate of said second NMOS transistor coupled to the source of said first NMOS transistor, the drain of said second NMOS transistor in communication with said output;

coupling the drain of said second NMOS transistor via a second current source to a positive voltage supply;

forming a feedback loop by coupling the positive input of an operational transconductance amplifier (OTA) to the drain of said second NMOS transistor and coupling the output of said OTA via resistive means to the gate of said first NMOS transistor;

coupling the negative input of said OTA to a reference voltage;

coupling the output of said OTA via capacitive means to a negative voltage supply, where said capacitive means together with said OTA form a low pass filter;

adjusting via said feedback loop a direct current drain voltage of said second NMOS transistor such that the voltage at the drain of said second NMOS transistor is precisely equal to said reference voltage; and selecting said reference voltage to be midway between said positive and said negative voltage supply to allow for a maximum signal swing at said output.

34. The method of claim 33, wherein said CMOS buffer amplifier drives a 50 ohm load at unity gain.

35. The method of claim 33, wherein the signal frequency response of said CMOS buffer amplifier ranges from 100 MHz to 2,000 MHz (MHz=$10^6$ Hertz).

36. The method of claim 33, wherein transistors of said OTA are operated in their weak inversion region.

37. The method of claim 33, wherein said feedback loop is only present at direct current (DC).

38. The method of claim 33, wherein said feedback loop is only present at very low frequencies.

* * * * *

UNITED STATES PATENT AND TRADEMARK OFFICE
CERTIFICATE OF CORRECTION

PATENT NO.    : 6,437,612 B1
DATED         : August 20, 2002
INVENTOR(S)   : Uday Dasgupta and Wooi Gan Yeoh It is certified that error appears in the above-identified patent and that said Letters Patent is hereby corrected as shown below:

<u>Title page,</u>
Item [75], delete "Wooi Gan Teoh" and replace it with -- Wooi Gan Yeoh --.

Signed and Sealed this

Eighteenth Day of February, 2003

JAMES E. ROGAN
*Director of the United States Patent and Trademark Office*